United States Patent
Lin et al.

(10) Patent No.: US 8,384,155 B2
(45) Date of Patent: Feb. 26, 2013

(54) SEMICONDUCTOR CAPACITOR

(75) Inventors: Chrong-Jung Lin, Taipei County (TW);
Hsin-Ming Chen, Tainan County (TW);
Ya-Chin King, Taoyuan County (TW)

(73) Assignee: eMemory Technology Inc., Hsin-Chu (TW)

( * ) Notice: Subject to any disclaimer, the term of this patent is extended or adjusted under 35 U.S.C. 154(b) by 1635 days.

(21) Appl. No.: 11/697,070

(22) Filed: Apr. 5, 2007

(65) Prior Publication Data

US 2008/0019165 A1 Jan. 24, 2008

Related U.S. Application Data

(60) Provisional application No. 60/807,615, filed on Jul. 18, 2006.

(30) Foreign Application Priority Data

Jan. 2, 2007 (TW) ................................ 96100080 A

(51) Int. Cl.
*H01L 29/94* (2006.01)

(52) U.S. Cl. ............... 257/347; 257/102; 257/E29.345; 257/E21.176; 257/E21.649

(58) Field of Classification Search .................. 257/347, 257/E29.345, E21.176, E21.649; 365/102
See application file for complete search history.

(56) References Cited

U.S. PATENT DOCUMENTS

| | | | |
|---|---|---|---|
| 6,650,143 B1 | 11/2003 | Peng | |
| 6,667,902 B2 | 12/2003 | Peng | |
| 6,671,040 B2 | 12/2003 | Fong et al. | |
| 6,678,190 B2 | 1/2004 | Yang et al. | |
| 6,700,151 B2 | 3/2004 | Peng | |
| 6,762,109 B2 * | 7/2004 | Murata | 438/396 |
| 6,766,690 B2 | 7/2004 | Tabota | |
| 6,777,757 B2 | 8/2004 | Peng et al. | |
| 6,791,891 B1 | 9/2004 | Peng et al. | |
| 6,798,693 B2 | 9/2004 | Peng | |
| 6,822,888 B2 | 11/2004 | Peng | |
| 6,856,540 B2 | 2/2005 | Peng et al. | |
| 6,896,116 B2 | 5/2005 | Deaville et al. | |
| 6,924,664 B2 | 8/2005 | Wang | |
| 6,940,751 B2 | 9/2005 | Peng et al. | |
| 6,956,258 B2 | 10/2005 | Peng | |
| 6,972,986 B2 | 12/2005 | Peng et al. | |
| 6,992,925 B2 | 1/2006 | Peng | |
| 7,459,747 B2 * | 12/2008 | Obuchi | 257/312 |
| 2006/0221698 A1 * | 10/2006 | Obuchi | 365/185.18 |

* cited by examiner

*Primary Examiner* — David Vu
*Assistant Examiner* — Brandon Fox
(74) *Attorney, Agent, or Firm* — J.C. Patents

(57) ABSTRACT

A one time programmable memory cell having a gate, a gate dielectric layer, a source region, a drain region, a capacitor dielectric layer and a conductive plug is provided herein. The gate dielectric layer is disposed on a substrate. The gate is disposed on the gate dielectric layer. The source region and the drain region are disposed in the substrate at the sides of the gate, respectively. The capacitor dielectric layer is disposed on the source region. The capacitor dielectric layer is a resistive protection oxide layer or a self-aligned salicide block layer. The conductive plug is disposed on the capacitor dielectric layer. The conductive plug is served as a first electrode of a capacitor and the source region is served as a second electrode of the capacitor. The one time programmable memory (OTP) cell is programmed by making the capacitor dielectric layer breakdown.

14 Claims, 9 Drawing Sheets

SEMICONDUCTOR CAPACITOR

CROSS-REFERENCE TO RELATED APPLICATION

This application claims the priority benefit of U.S.A. provisional application Ser. No. 60/807,615, filed on Jul. 18, 2006, all disclosures are incorporated therewith.

BACKGROUND OF THE INVENTION

1. Field of the Invention

The present invention generally relates to a semiconductor device, in particular, to a semiconductor capacitor, a one time programmable memory cell and a fabricating method and an operating method thereof.

2. Description of Related Art

With the advantage of retaining the stored data even after power to the device is cut-off, the non-volatile memory device has become a kind of memory device wildly employed in personal computers and electronic devices.

Generally, non-volatile memories is classified as erasable programmable read only memory (EPROM), electrically erasable programmable read only memory (EEPROM), mask read only memory and one time programmable read only memory (OTPROM) etc.

With respect to EPROM and EEPROM, due to their recordable and erasable capabilities, EPROM and EEPROM are preferable choices in practice. However, the manufacturing process of EPROM and EEPROM is relatively complex and costly.

With respect to mask ROM, though the manufacturing process is relatively simple and the cost is relatively low, masks are required to define data to be recorded. Thus, there are many limitations during usage.

With respect to one time programmable ROM, because data is recorded after the memories have been left the factory, that is, data is recorded by users according to configuration situations of the memories, they are more convenient than mask ROM in practice.

When semiconductor technology enters deep sub-micron manufacturing process, the size of device is gradually decreased, which means decreased memory cell size with respect to memory device. On the other hand, as data which information electronic products (such as computer, mobile phone, digital camera and personal digital assistant (PDA)) have to handle and store are increased, the memory capacity required in these information electronic products becomes larger and larger. In the case of decreased device size and increased memory capacity demand, a common goal in the field is how to fabricate memory devices having decreased size, high integration and still keeping good qualities.

SUMMARY OF THE INVENTION

Therefore, the present invention provides a semiconductor capacitor which utilizes a resistive protection oxide layer or a self-aligned silicide block layer as a capacitor dielectric layer. No additional manufacturing process is required, so the manufacturing process of the semiconductor device is simple, and the integration of this semiconductor device is increased.

The present invention provides a one time programmable memory cell which utilizes a resistive protection oxide layer or a self-aligned silicide block layer as a capacitor dielectric layer and utilizes a source of a transistor and a conductive plug as electrodes of a capacitor. The size of this device is decreased and the integration of this semiconductor device is increased.

The present invention provides a fabricating method of a one time programmable memory cell. This method is compatible with common complementary metal oxide-semiconductor manufacturing processes. No additional manufacturing process is required.

The present invention provides an operating method of a one time programmable memory cell. The method includes programming memory cells by making a capacitor dielectric layer breakdown. The memory cells are recorded one time and data stored in the memory cells are non-volatile.

The present invention provides a semiconductor capacitor including a capacitor dielectric layer, a first electrode and a second electrode. The capacitor dielectric layer is a resistive protection oxide layer or a self-aligned silicide block layer. The first and second electrodes are disposed at the opposing sides of the capacitor dielectric layer.

According to one preferred embodiment of the present invention, the first electrode is a conductive plug.

According to one preferred embodiment of the present invention, the semiconductor capacitor further includes an etch stop layer disposed on the capacitor dielectric layer. The first electrode extends through the etch stop layer and contacts with the capacitor dielectric layer.

According to one preferred embodiment of the present invention, the semiconductor capacitor is disposed on a substrate. The second electrode is a doped region disposed in the substrate. The capacitor dielectric layer is disposed on the doped region and exposes a portion of the doped region. The first electrode is disposed on the capacitor dielectric layer.

According to one preferred embodiment of the present invention, the substrate includes a silicon substrate.

According to one preferred embodiment of the present invention, the semiconductor capacitor further includes a metal silicide layer and a second conductive plug. The metal silicide layer is disposed on the doped region exposed from the capacitor dielectric layer. The second conductive plug is electrically connected to the metal silicide layer.

According to one preferred embodiment of the present invention, the first electrode is formed from one or more first conductive plugs. The shape of the first conductive plug is square, rectangle, round or other shapes.

According to one preferred embodiment of the present invention, the substrate is a silicon on insulator substrate. The doped region is disposed in a silicon layer of the silicon on insulator substrate.

According to one preferred embodiment of the present invention, the semiconductor capacitor further includes a metal silicide layer and a second conductive plug. The metal silicide layer is disposed on the doped region exposed from the capacitor dielectric layer. The second conductive plug is electrically connected to the metal silicide layer.

According to one preferred embodiment of the present invention, the first electrode is formed from one or more first conductive plugs. The shape of the first conductive plug is square, rectangle, round or other shapes.

According to one preferred embodiment of the present invention, the semiconductor capacitor is disposed on an isolation structure of the substrate. The second electrode is a doped polysilicon layer disposed on the substrate. The capacitor dielectric layer is disposed on the doped polysilicon layer and exposes a portion of the doped polysilicon layer. The first electrode is disposed on the capacitor dielectric layer.

According to one preferred embodiment of the present invention, the semiconductor capacitor further includes a metal silicide layer and a second conductive plug. The metal silicide layer is disposed on the doped region exposed from the capacitor dielectric layer. The second conductive plug is electrically connected to the metal silicide layer.

According to one preferred embodiment of the present invention, the first electrode is formed from one or more first conductive plugs. The shape of the first conductive plug is square, rectangle, round or other shapes.

According to one preferred embodiment of the present invention, the semiconductor capacitor is disposed on an insulating substrate. The second electrode is a doped semiconductor layer disposed on the insulating substrate. The capacitor dielectric layer is disposed on the doped semiconductor layer and exposes a portion of a doped semiconductor layer. The first electrode is disposed on the capacitor dielectric layer.

According to one preferred embodiment of the present invention, the semiconductor capacitor further includes a metal silicide layer and a second conductive plug. The metal silicide layer is disposed on the doped semiconductor layer exposed from the capacitor dielectric layer. The second conductive plug is electrically connected to the metal silicide layer.

According to one preferred embodiment of the present invention, the first electrode is formed from one or more first conductive plugs. The shape of the first conductive plug is square, rectangle, round or other shapes.

According to one preferred embodiment of the present invention, the insulating substrate is a glass substrate.

In the semiconductor capacitor of the present invention, a resistive protection oxide layer or a self-aligned silicide block layer is served as a capacitor dielectric layer, and a conductive plug (first electrode) and a doped region or a doped semiconductor layer (second electrode) are served as electrodes of the capacitor. Wherein, the doped region is a source/drain region of a transistor or is fabricated together with a source/drain region of the transistor in a same manufacturing process. The doped semiconductor layer is fabricated together with a gate of the transistor in a same manufacturing process. The conductive plug is fabricated together with plugs connected to the gate, source/drain region of the transistor in a same manufacturing process. Therefore, a capacitor is fabricated without varying the manufacturing process of common complementary metal oxide-semiconductor, the integration of semiconductor devices is elevated and the cost of manufacture is reduced.

The present invention provides a one time programmable memory cell including a gate, a gate dielectric layer, a source region, a drain region, a capacitor dielectric layer, and a conductive plug. The gate dielectric layer is disposed on a substrate. The gate is disposed on the gate dielectric layer. The source and drain regions are disposed in the substrate at the sides of the gate, respectively. The capacitor dielectric layer is disposed on the source region, and the capacitor dielectric layer is a resistive protection oxide layer or a self-aligned silicide block layer. The conductive plug is disposed on the capacitor dielectric layer, wherein the conductive plug is served as a first electrode of a capacitor, and the source region is served as a second electrode of the capacitor.

In the one time programmable memory cell of the present invention, a resistive protection oxide layer or a self-aligned silicide block layer is served as a capacitor dielectric layer, and a conductive plug and a source region are served as electrodes of a capacitor. Therefore, the capacitor is fabricated without varying the manufacturing process of common complementary metal oxide-semiconductor. The capacitor is directly disposed on the source region, so the integration of semiconductor devices is elevated and the cost of manufacture is reduced.

The present invention provides an operating method of a one time programmable memory cell, the memory cell includes a substrate of first conductive type, a gate dielectric layer and a gate disposed on the substrate of first conductive type, a source region and a drain region of second conductive type disposed in the substrate of first conductive type at the sides of the gate, a capacitor dielectric layer disposed on the source region of second conductive type and a conductive plug disposed on the capacitor dielectric layer, wherein the capacitor dielectric layer is a resistive protection oxide layer or a self-aligned silicide block layer. This method includes programming the memory cell by making the capacitor dielectric layer breakdown.

According to one preferred embodiment of the present invention, the first conductive type is P-type, and the second conductive type is N-type. The process of programming the memory cell includes following steps. A first voltage is applied on the conductive plug, a second voltage is applied on the substrate of first conductive type, a third voltage is applied on the drain region of second conductive type, and a fourth voltage is applied on the gate. The first, second and third voltages are set to make the capacitor dielectric layer breakdown. The fourth voltage is set to open a channel under the gate.

According to one preferred embodiment of the present invention, the first voltage is about 4 to 6 Volts, the second voltage is about 0 Volt, the third voltage is about 0 Volt, the fourth voltage is about 1 to 2 Volts.

According to one preferred embodiment of the present invention, the substrate of first conductive type includes a well of second conductive type and a well of first conductive type disposed on the well of second conductive type. The first conductive type is P type, and the second conductive type is N type. The process of programming the memory cell includes following steps. The substrate of first conductive type and the well of second conductive type are grounding, a fifth voltage is applied on the conductive plug, a sixth voltage is applied on the gate, a seventh voltage is applying on the drain region of second conductive type and a eighth voltage is applied on the well of first conductive type. The fifth, seventh and eighth voltages are set to make the capacitor dielectric layer breakdown. The sixth voltage is set to open a channel under the gate.

According to one preferred embodiment of the present invention, the fifth voltage is about 3.3 Volts, the sixth voltage is about 0 Volt, the seventh voltage is about −3.3 Volts, and the eighth voltage is about −3.3 Volts.

According to one preferred embodiment of the present invention, the first conductive type is N type, and the second conductive type is P type. The process of programming the memory cell includes following steps. A ninth voltage is applied on the conductive plug, a tenth voltage is applied on the substrate of first conductive type and a eleventh voltage is applied on the drain region of second conductive type, a twelfth voltage is applied on the gate. The ninth, tenth and eleventh voltage are set to make the capacitor dielectric layer breakdown, the twelfth voltage is set to open a channel under the gate.

According to one preferred embodiment of the present invention, the ninth voltage is about −3.3 Volts, the tenth voltage is about 3.3 Volts, the eleventh voltage is about 3.3 Volts, and the twelfth voltage is about 0 Volt.

According to one preferred embodiment of the present invention, the first conductive type is N type, and the second conductive type is P type. The process of programming the memory cell includes following steps. A thirteenth voltage is applied on the conductive plug, a fourteenth voltage is applied on the substrate of first conductive type and a fifteenth voltage is applied on the gate, a sixteenth voltage is applied on the drain region of second conductive type. The thirteenth voltage, the fourteenth voltage and sixteenth voltage are set to make the capacitor dielectric layer breakdown.

According to one preferred embodiment of the present invention, the thirteenth voltage is about 0 Volt, the fourteenth voltage is about 4 to 6 Volts, the fifteenth voltage is about 3.3 Volts, and the sixteenth voltage is about 4 to 6 Volts.

According to one preferred embodiment of the present invention, during programming, a dielectric layer of a capacitor is damaged (breakdown) by controlling voltages applied on a gate, a drain, a source and a substrate of a transistor. Digital information "0" or "1" is recorded by detecting whether the dielectric layer of the capacitor is damaged or not. The contact area of conductive plug with the capacitor dielectric layer is relatively small, which can result in increased current destiny where the conductive plug contacts with the capacitor dielectric layer when a one time programmable memory cell of the present invention is programmed. This can readily make the capacitor dielectric layer breakdown and the operating voltages are reduced.

The present invention provides a fabricating method of a one time programmable memory cell. At first, a substrate provided with a transistor thereon is provided. The transistor includes a gate, a first source/drain region and a second source/drain region. Next, a dielectric layer is formed on the first source/drain region. The dielectric layer is a resistive protection oxide layer or a self-aligned silicide block layer. Subsequently, a metal silicide layer is formed on the gate and the second source/drain region. Then, a first conductive plug is formed on the dielectric layer. The first conductive plug, the dielectric layer and the first source/drain region form a capacitor.

According to one preferred embodiment of the present invention, the step of forming the dielectric layer on the first source/drain region includes following sub-steps. At first, the dielectric layer is formed on a substrate and a mask layer covering the first source/drain region is formed on the substrate. Subsequently, the mask layer is served as a mask and the portion of the dielectric layer uncovered by the mask is removed. Then, the mask layer is removed.

According to one preferred embodiment of the present invention, an etch stop layer and an interlayer insulating layer are formed on the substrate before the step of forming the first conductive plug on the dielectric layer.

According to one preferred embodiment of the present invention, the material of the etch stop layer includes silicon nitride (SiN) or silicon oxynitride (SiON).

According to one preferred embodiment of the present invention, the step of forming the first conductive plug on the dielectric layer further includes forming a second conductive plug electrically connected to the second source/drain region.

According to one preferred embodiment of the present invention, the material of the dielectric layer includes silicon oxide.

According to one preferred embodiment of the present invention, the process of forming the metal silicide layer on the gate and the second source/drain region includes self-aligning metal silicides process.

In the fabricating method of a one time programmable memory cell of the present invention, a capacitor is directly formed from a first conductive plug, a resistive protection oxide layer or a self-aligned silicide block layer and a first source/drain region. The capacitor is fabricated without varying common complementary metal oxide-semiconductor manufacturing process, and the capacitor is directly disposed on the first source/drain region. No additional space is required and the integration of semiconductor devices is elevated.

BRIEF DESCRIPTION OF THE DRAWINGS

These and other features and advantages of the present invention will be described and become more apparent from the detailed description of exemplary embodiments when read in conjunction with accompanying drawings.

DETAILED DESCRIPTION OF EMBODIMENTS

The present invention provides a semiconductor capacitor, a one time programmable memory cell having the semiconductor capacitor and a fabricating method and an operating method thereof.

At first, a semiconductor capacitor according to the present invention will be described.

Figure 1A:
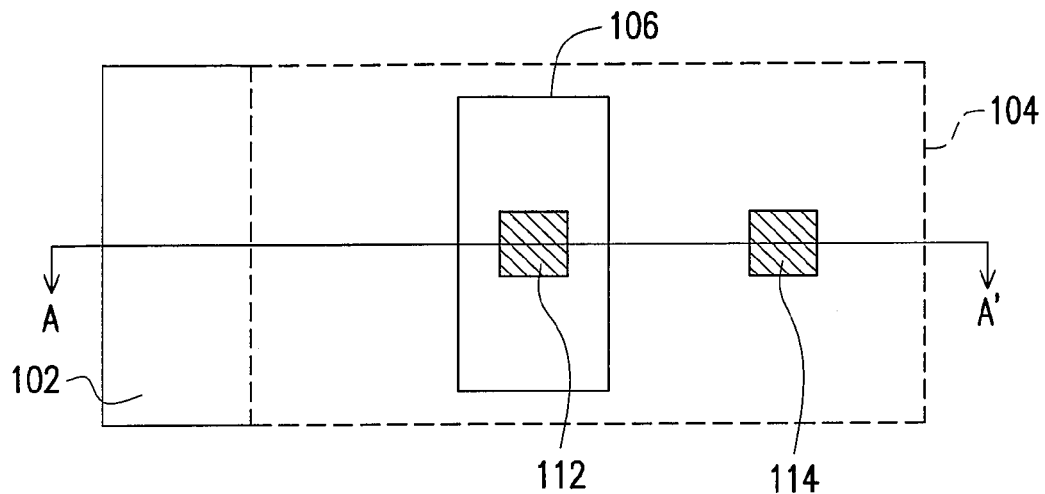
FIG. 1A is a schematic top view illustrating a semiconductor capacitor according to a preferred embodiment of the present invention.
Figure 1B:
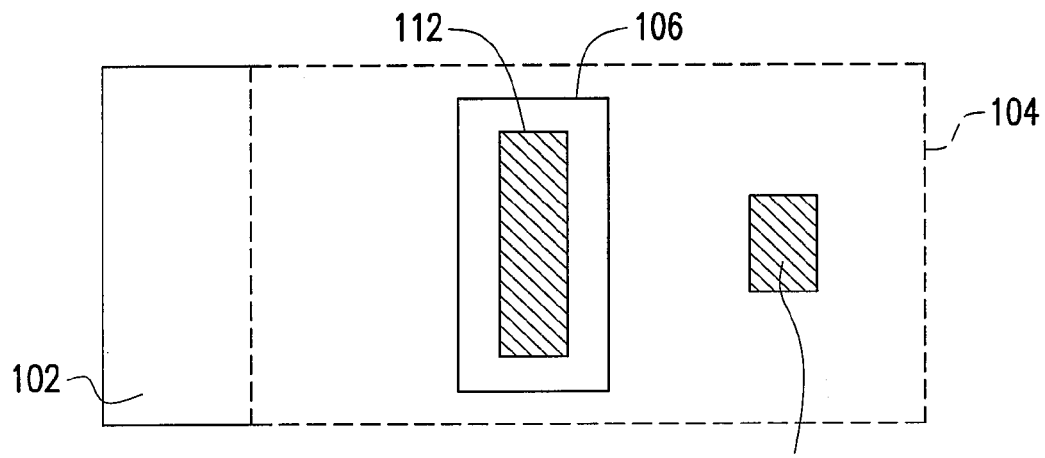
FIGS. 1B and 1C are top views illustrating a semiconductor capacitor according to another preferred embodiment of the present invention, respectively.
Figure 1C:
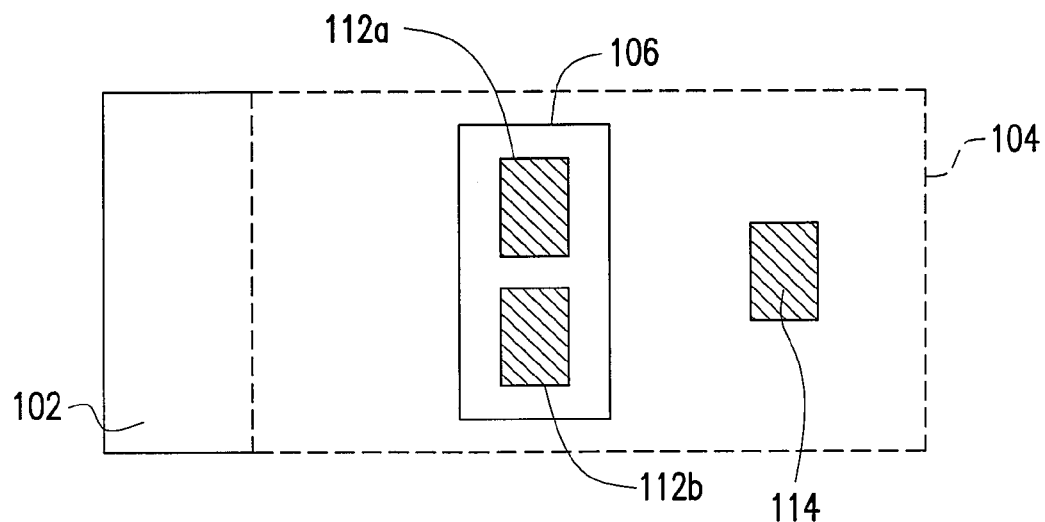
Figure 2A:
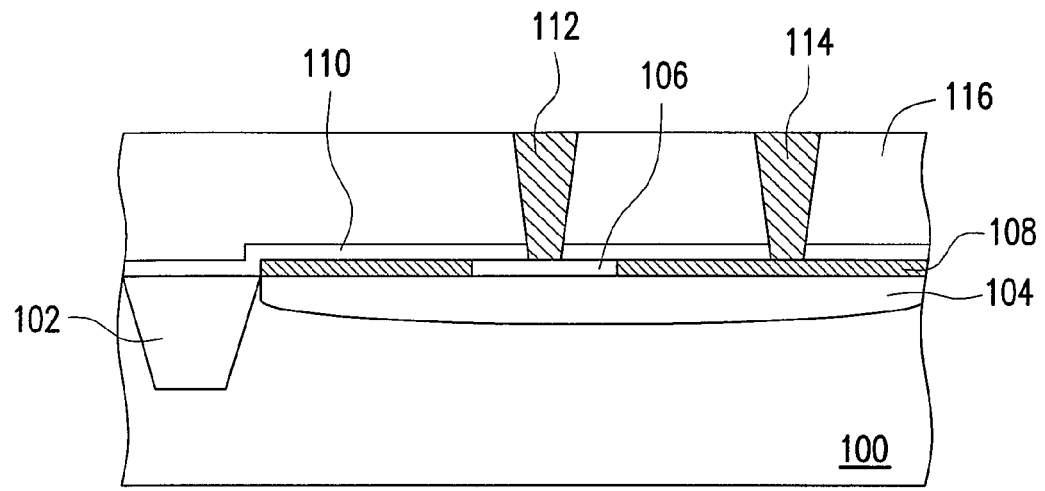
FIG. 2A is a cross-sectional view taken along line A-A' in FIG. 1A.

FIG. 1A is a schematic top view illustrating a semiconductor capacitor according to a preferred embodiment of the present invention. FIG. 2A is a cross-sectional view taken along line A-A' in FIG. 1A. FIGS. 1B and 1C are top views illustrating a semiconductor capacitor according to another preferred embodiment of the present invention, respectively. The members in FIGS. 1B and 1C that are same with those in FIG. 1A will be designated by same reference numbers, respectively and their illustrations will be omitted.

Please refer to FIGS. 1A and 2A, a semiconductor capacitor according to the present invention is disposed on a substrate 100, for example. The substrate 100 is provided with an isolation structure 102 to define an active area. For example, the isolation structure 102 is a shallow trench isolation structure or a field oxide layer. The semiconductor capacitor is formed from a conductive plug 112 (first electrode), a capacitor dielectric layer 106 and a doped region 104 (second electrode). The conductive plug 112 (first electrode) and the doped region 104 (second electrode) are served as electrodes of the semiconductor capacitor.

For example, the substrate 100 is a silicon substrate. The capacitor dielectric layer 106 is, for example, a resistive protection oxide layer or a self-aligned silicide block layer commonly used in semiconductor manufacturing process. The material of the capacitor dielectric layer 106 is silicon oxide, silicon nitride or other dielectric material (e.g. high-k material).

The conductive plug 112 (first electrode) and the doped region 104 (second electrode) are disposed at the opposing sides of the capacitor dielectric layer 106. The doped region 104 (second electrode) is disposed in the substrate 100, for example. The capacitor dielectric layer 106 is, for example, disposed on the doped region 104 (second electrode), and can expose a portion of the doped region 104 (second electrode). The conductive plug 112 (first electrode) is disposed on the capacitor dielectric layer 106. As shown in FIG. 1A, the capacitor dielectric layer 106 only covers a portion of the doped region 104 (second electrode).

For example, a metal silicide layer 108 is disposed on the doped region 104 (second electrode) exposed from the capacitor dielectric layer 106. The material of the metal silicide layer 108 includes metal silicide of refractory metal, such as one silicide of nickel, cobalt, titanium, copper, molybdenum, tantalum, tungsten, erbium, zirconium, platinum and silicide of alloys thereof.

For example, an etch stop layer 110 is disposed on the capacitor dielectric layer 106 and the doped region 104 (second electrode). The material of the etch stop layer 110 is, for example, silicon nitride or silicon oxynitride. The conductive plug 112 (first electrode) extends through the etch stop layer 110 and contacts with the capacitor dielectric layer 106. The etch stop layer 110 plays a very important role in the manufacturing process of the conductive plug 112. The primary reason is that the etch stop layer 110 can give more stably etching process of forming plugs, it can make etching of the plugs to stop at the etch stop layer 110 by utilizing different etching selectivity of different materials. Finally, the etch stop layer 110 is be etched. In present invention, because a resistive protection oxide layer or a self-aligned silicide block layer is disposed under the etch stop layer 110, etching will stop at the resistive protection oxide layer or the self-aligned silicide block layer, the conductive plug 112 (first electrode) of the capacitor dielectric layer 106 is readily formed.

An interlayer insulating layer 116 is further disposed on the etch stop layer 110. The interlayer insulating layer 116 is, for example, phosphorosilicate glass borophosphorosilicate glass etc. The conductive plug 112 (first electrode) and the conductive plug 114 which is electrically connected to the metal silicide layer 108 are disposed in the interlayer insulating layer 116. The material of the conductive plug 112 (first electrode) and the conductive plug 114 includes conductive material such as metal material or doped polysilicon.

Seen from the top view of FIG. 1A, the shape of the conductive plug 112 (first electrode) is, for example, square. Of course, the shape of the conductive plug 112 (first electrode) can also be rectangle as shown in FIG. 1B, or other suitable shapes such as round or oval. Additionally, the first electrode of the semiconductor capacitor in the present invention is not only limited to one. As also shown in FIG. 1C, two or more conductive plugs 112a, 112b (first electrode) is provided.

Figure 2B:
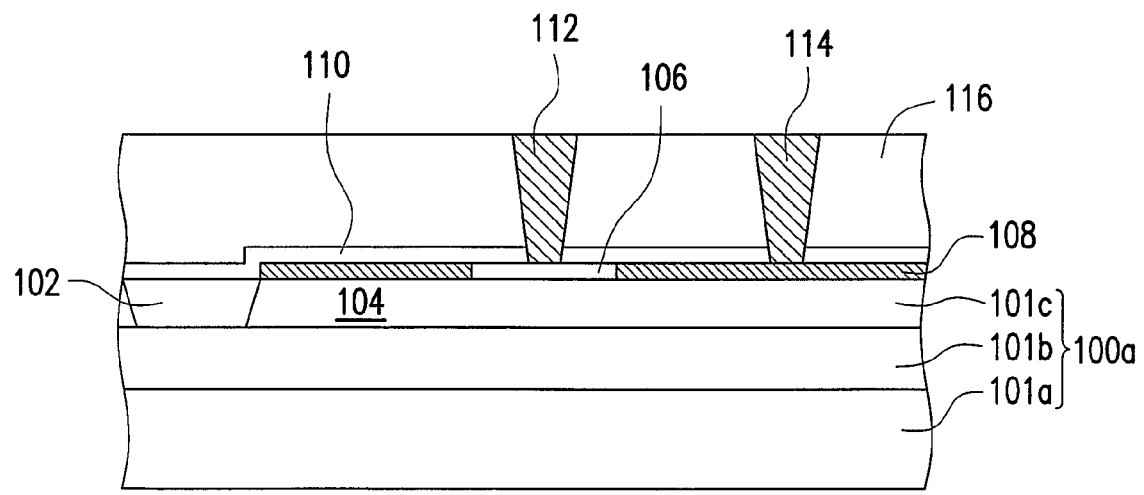
FIGS. 2B to 2D are cross-sectional views illustrating other preferred embodiments of the semiconductor capacitor according to the present invention, respectively.
Figure 2C:
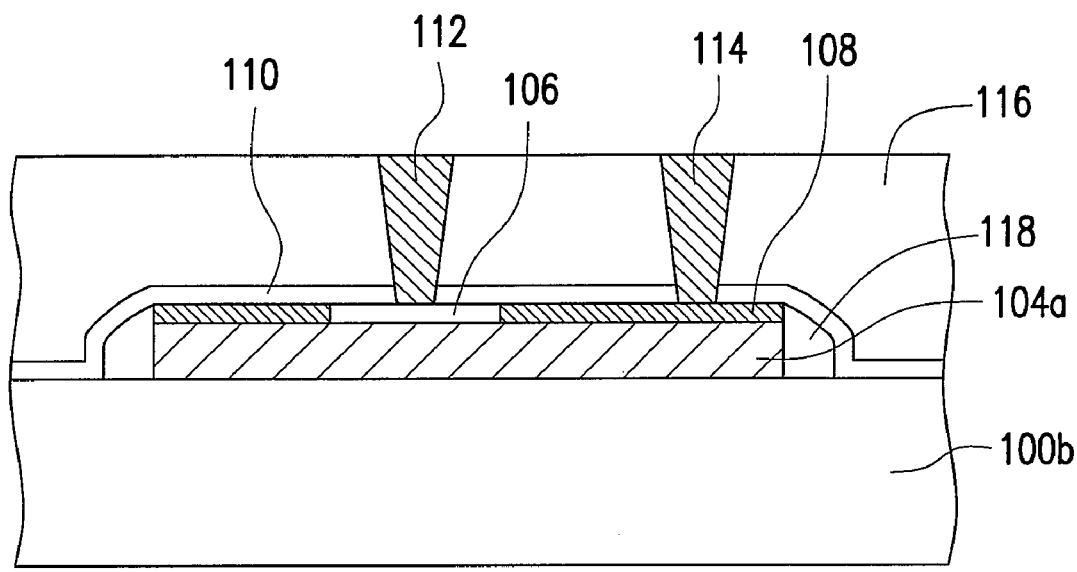
Figure 2D:
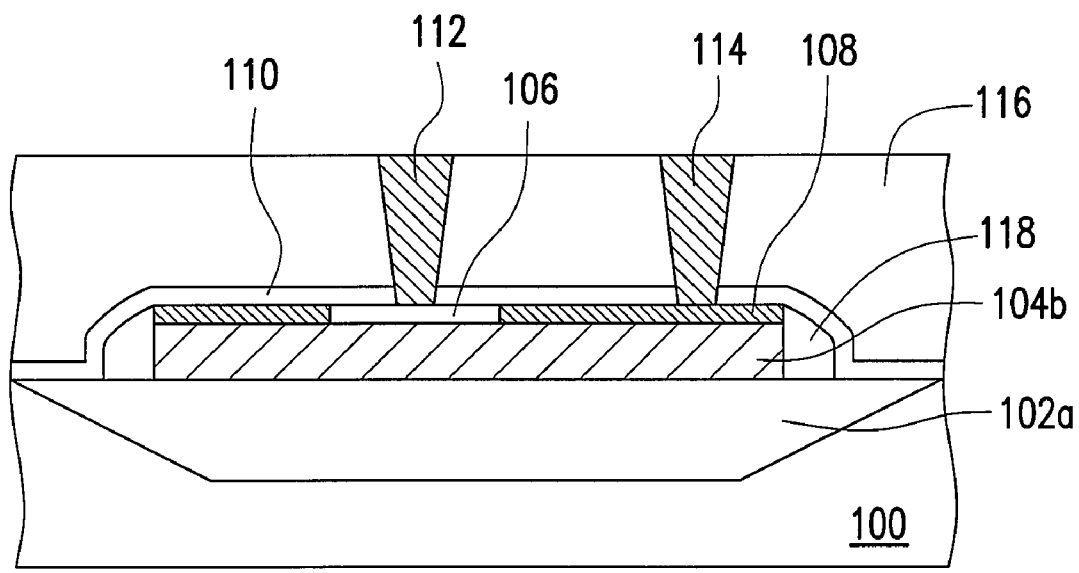

FIGS. 2B to 2D are cross-sectional views illustrating other preferred embodiments of the semiconductor capacitor according to the present invention, respectively. In FIGS. 2B to 2D, members which are same with those in FIG. 1A are designated by same reference numbers, respectively, and their illustrations will be omitted.

Please refer to FIG. 2B, a semiconductor capacitor is disposed on a silicon on insulator (SOI) substrate 100a, for example. The silicon on insulator substrate 100a is formed from, for example, a substrate layer 101a, an insulating layer 101b and a silicon layer 101c.

The doped region 104 (second electrode) is, for example, disposed in the silicon layer 101c of the silicon on insulator substrate 100a. The capacitor dielectric layer 106 is, for example, disposed on the silicon layer 101c, and exposes a portion of the doped region 104 (second electrode). The conductive plug 112 (first electrode) is, for example, disposed on the capacitor dielectric layer 106.

The metal silicide layer 108 is disposed on the doped region 104 (second electrode) which is exposed on the capacitor dielectric layer 106, and the etch stop layer 110 is disposed on the capacitor dielectric layer 106 and the doped region 104 (second electrode). The interlayer insulating layer 116 is disposed on the etch stop layer 110, for example. The shape of the conductive plug 112 (first electrode) is, for example, square, rectangle or other suitable shapes such as round or oval. The number of the conductive plug 112 (first electrode) is not only limited to one, and can also be two or more.

In the semiconductor capacitors shown in FIGS. 2A and 2B, a resistive protection oxide layer or a self-aligned silicide block layer is served as the capacitor dielectric layer 106, and the conductive plug 112 and the doped region 104 are served as electrodes of a capacitor. The doped region 104 is a source/drain region of a transistor or is fabricated together with a source/drain region of a transistor in a same manufacturing process. The conductive plug 112 is fabricated together with plugs connected to a gate, source/drain region of a transistor in a same manufacturing process. Therefore, a capacitor is fabricated without varying the manufacturing process of common complementary metal oxide-semiconductor. No additional space is required, and the integration of semiconductor devices is elevated.

Please refer to FIG. 2C, a semiconductor capacitor is, for example, disposed on an insulating substrate 100b. The insulating substrate 100b is, for example, a glass substrate or a plastic substrate etc.

A doped semiconductor layer 104a (second electrode) is, for example, disposed on the insulating substrate 100b. The material of the doped semiconductor layer 104a is, for example, doped silicon or doped polysilicon etc. The doped semiconductor layer 104a and a gate layer of a transistor are fabricated in a same manufacturing process. That is, while patterning a gate of a MOS transistor, a doped semiconductor layer 104a (second electrode) of a capacitor is defined. Therefore, no other additional steps are required, when the capacitor of the present invention is fabricated. A capacitor dielectric layer 106 is, for example, disposed on the doped semiconductor layer 104a (second electrode), and exposes a portion of the doped semiconductor layer 104a (second electrode). The conductive plug 112 (first electrode) is, for example, disposed on the capacitor dielectric layer 106.

The metal silicide layer 108 is, for example, disposed on the doped semiconductor layer 104a (second electrode) exposed from the capacitor dielectric layer 106 and the etch stop layer 110 is disposed on the capacitor dielectric layer 106 and the doped semiconductor layer 104a (second electrode). The interlayer insulating layer 116 is disposed on the etch stop layer 110, for example. The shape of the conductive plug 112 (first electrode) is, for example, square, rectangle or other suitable shapes such as round or oval. The number of the conductive plug 112 (first electrode) is not only limited to one, and can also be two or more. Additionally, an insulating spacer 118 is, for example, disposed on a sidewall of the doped semiconductor layer 104a. The material of the insulating spacer 118 is, for example, silicon oxide or silicon nitride etc.

Please refer to FIG. 2D, a semiconductor capacitor is, for example, disposed on an isolation structure 102a of the substrate 100.

A doped semiconductor layer 104b (second electrode) is, for example, disposed on the isolation structure 102a. The material of the doped semiconductor layer 104b is, for example, doped silicon or doped polysilicon etc. Similarly, the doped semiconductor layer 104b and a gate layer of a transistor are fabricated in a same manufacturing process. That is, while patterning a gate of a MOS transistor, the doped semiconductor layer 104b (second electrode) of a capacitor is defined. Therefore, no other additional steps are required, when a capacitor of the present invention is fabricated. The capacitor dielectric layer 106 is, for example, disposed on the doped semiconductor layer 104b (second electrode), and exposes a portion of the doped semiconductor layer 104b (second electrode). The conductive plug 112 (first electrode) is, for example, disposed on the capacitor dielectric layer 106.

The metal silicide layer 108 is, for example, disposed on the doped semiconductor layer 104b (second electrode) exposed from the capacitor dielectric layer 106 and the etch stop layer 110 is disposed on the capacitor dielectric layer 106 and the doped semiconductor layer 104b (second electrode). The interlayer insulating layer 116 is, for example, disposed on the etch stop layer 110. The shape of the conductive plug 112 (first electrode) is, for example, square, rectangle or other suitable shapes such as round or oval. The number of the conductive plug 112 (first electrode) is not only limited to one, and can also be two or more. Additionally, the insulating spacers 118 are, for example, disposed on sidewalls of the doped semiconductor layer 104a. The material of the insulating spacers 118 is, for example, silicon oxide or silicon nitride etc.

In the semiconductor capacitors in FIGS. 2C to 2D, a resistive protection oxide layer or a self-aligned silicide block layer is served as the capacitor dielectric layer 106, and the conductive plug 112 and the doped semiconductor layer 104a (104b) are served as electrodes of a capacitor. The doped semiconductor layer 104a (104b) is fabricated together with a gate of a transistor in a same manufacturing process. The conductive plug 112 is fabricated together with plugs connected to a gate, source/drain region of a transistor in a same manufacturing process. Therefore, a capacitor is fabricated without varying the manufacturing process of common complementary metal oxide-semiconductor. No additional space is required, and the integration of semiconductor devices is elevated.

Next, a one time programmable memory cell of the present invention will be described. The one time programmable memory cell of the present invention includes the aforementioned semiconductor capacitor.

Figure 3A:
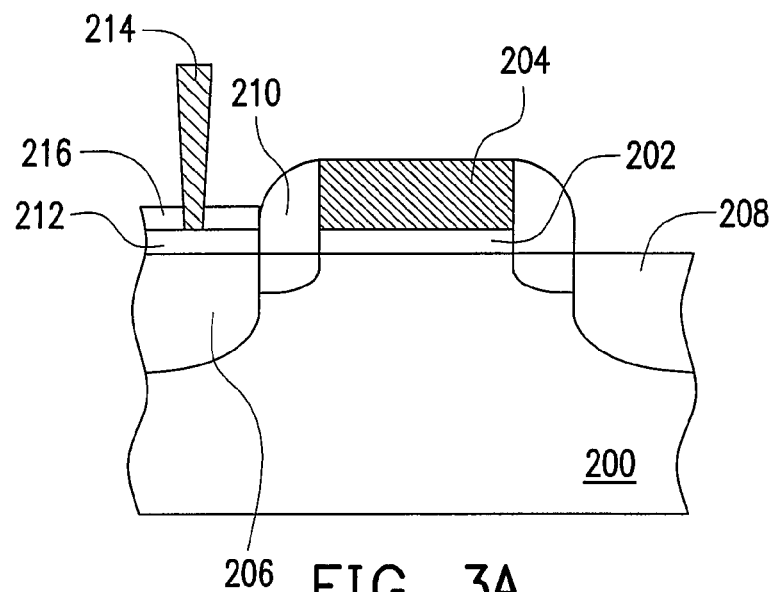
FIG. 3A is a schematic view of a one time programmable memory cell according to a preferred embodiment of the present invention.
Figure 3B:
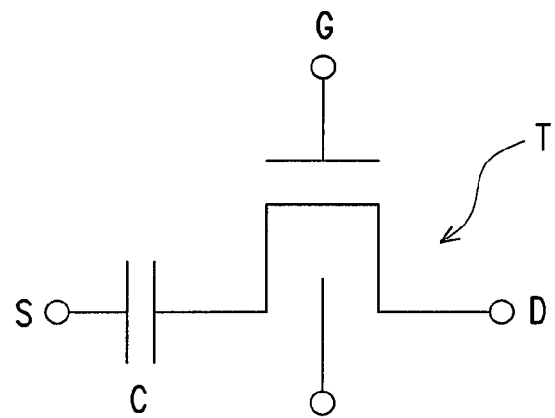
FIGS. 3B and 3C are schematic circuit diagrams of the one time programmable memory cell according to the present invention.
Figure 3C:
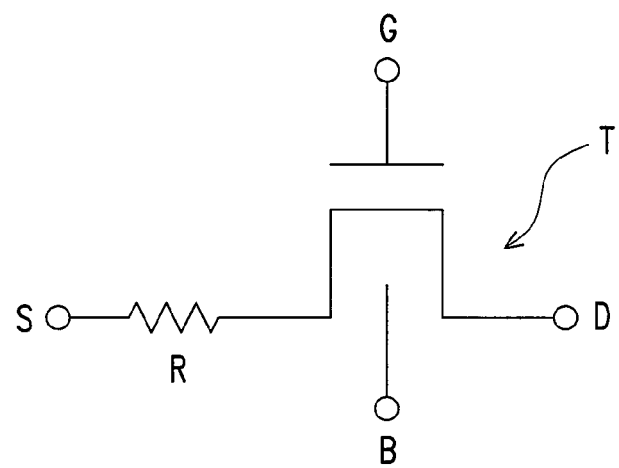

FIG. 3A is a schematic view of a one time programmable memory cell according to a preferred embodiment of the present invention. FIGS. 3B and 3C are schematic circuit diagrams of the one time programmable memory cell according to the present invention.

Please refer to FIG. 3A, the one time programmable memory cell of the present invention is disposed on a substrate 200. The one time programmable memory cell includes a gate dielectric layer 202, a gate 204, a source region 206, a drain region 208, spacers 210, a capacitor dielectric layer 212, a conductive plug 214 and an etch stop layer 216. The one time programmable memory cell of the present invention can be an N type channel memory cell, and can also be a P type channel memory cell.

The gate 204 is, for example, disposed on the substrate 200. The material of the gate 204 includes conductive material, such as metal or doped polysilicon. The gate dielectric layer 202 is, for example, disposed between the gate 204 and the substrate 200. The martial of the gate dielectric layer 202 includes silicon oxide or high-k material having dielectric constant higher than 4. The gate dielectric layer 202 can also be formed from one or more dielectric material layers. For example, the gate dielectric layer 202 is formed from a single silicon oxide layer or from a silicon oxide layer and a high-k material layer.

The spacers 210 are, for example, disposed on sidewalls of the gate 204. The material of the spacers 210 is, for example, silicon oxide or silicon nitride. The source region 206 and the drain region 208 are disposed in the substrate 200 on the sides of the gate 204, respectively.

The capacitor dielectric layer 212 is, for example, disposed on the source region 206, and the capacitor dielectric layer 212 is a resistive protection oxide layer or a self-aligned silicide block layer. The material of the capacitor dielectric layer 212 is, for example, silicon oxide or silicon nitride.

The conductive plug 214 is, for example, disposed on the capacitor dielectric layer 212. The conductive plug 214 is served as a first electrode of a capacitor, the source region 206 is served as a second electrode of the capacitor. The material of the conductive plug 214 includes conductive materials such as metal or doped polysilicon, etc. The etch stop layer 216 is, for example, disposed on the capacitor dielectric layer 212. The material of the etch stop layer 216 is, for example, silicon nitride or silicon oxynitride.

In the one time programmable memory cell according to the present invention, a resistive protection oxide layer or a self-aligned silicide block layer is served as the capacitor dielectric layer 212. The conductive plug 214 and the doped region 104 are served as electrodes of a capacitor. Therefore, a capacitor is fabricated without varying the manufacturing process of common complementary metal oxide-semiconductor. No additional space is required, and the integration of the semiconductor devices is elevated.

Please refer to the schematic circuit diagram in FIG. 3B, the one time programmable memory cell is formed from a transistor T and a capacitor C. A dielectric layer of the capacitor is damaged by controlling voltages applied on a gate G, a drain D, a source S and a substrate B of the transistor, to program the one time programmable memory cell of the present invention. When the dielectric layer of the capacitor has been damaged (breakdown), the capacitor C in transformed into a resistor R. Therefore, digital data "0" or "1" is recorded by detecting whether the dielectric layer of the capacitor has been damaged (breakdown) or not. Moreover, the dielectric layer cannot be recovered if damaged, so the memory cell can only be programmed one time.

Figure 4A:
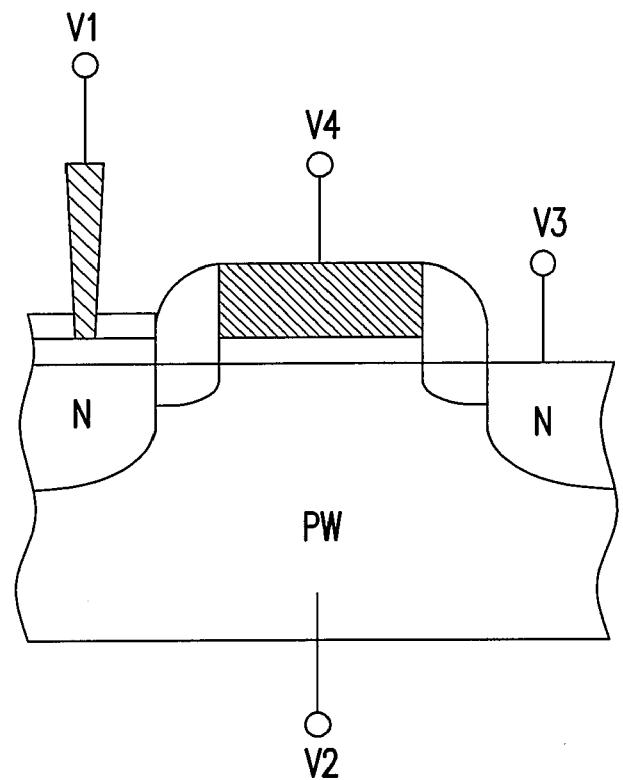
FIGS. 4A to 4B are schematic views illustrating programming operation of an N type memory cell, respectively.
Figure 4B:
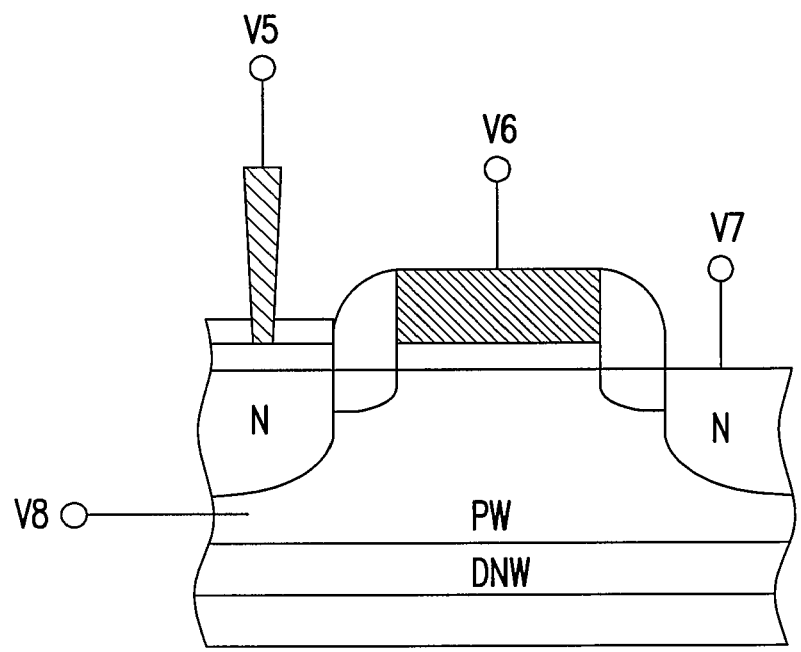

Next, an operating method according to the present invention will be illustrated. FIGS. 4A to 4B are schematic views illustrating programming operation of an N type memory cell.

Please refer to FIG. 4A, the memory cell includes a P type substrate (or P type well), a gate, a gate dielectric layer, an N type source region and an N type drain region, a capacitor dielectric layer and a conductive plug.

When the memory cell is programmed, a voltage V1 is applied on the conductive plug, a voltage V2 is applied on the P type substrate (or P type well) and a voltage V3 is applied on the N type drain region, a voltage V4 is applied on the gate. The voltage V4 is such set to open a channel under the gate, the voltage V1 and the voltage V2, V3 are such set to make capacitor dielectric layer breakdown. For example, the voltage V1 is about 4 to 6 Volts, the voltage V2 is about 0 Volt, the voltage V3 is also 0 Volt, the voltage V4 is about 1 to 2 Volts.

Please refer to FIG. 4B, a memory cell includes a P type substrate, a deep N type well DNW, a P type well PW, a gate, an N type source region and an N type drain region, a capacitor dielectric layer and a conductive plug.

When the memory cell is programmed, the P type substrate and the DNW region are grounding, a voltage V5 is applied on the conductive plug, a voltage V6 is applied on the gate, a voltage V7 is applied on the N type drain region, a voltage V8 is applied on the P type well PW. The voltages V5, V7 and the voltage V8 are set to make the capacitor dielectric layer breakdown. For example, the voltage V5 is about 3.3 Volts, the voltage V6 is about 0 Volt, the voltage V7 is about −3.3 Volts, and the voltage V8 is about −3.3 Volts.

Figure 5A:
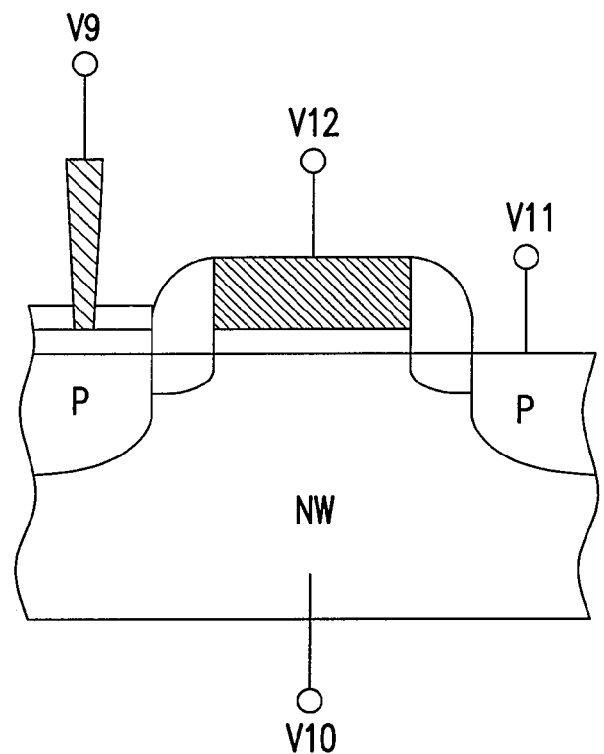
FIGS. 5A to 5B are schematic views illustrating programming operation of a P type memory cell, respectively.
Figure 5B:
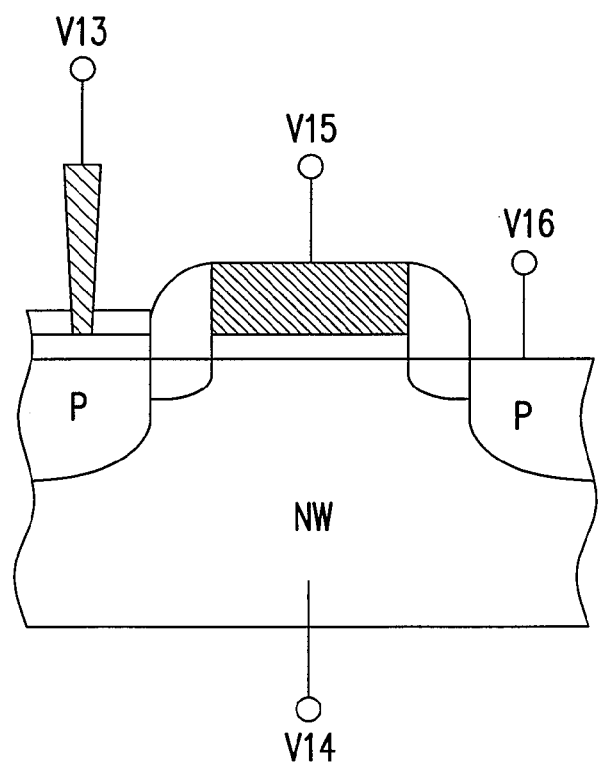

FIGS. 5A to 5B are schematic views illustrating programming operation of a P type memory cell.

Please refer to FIG. 5A, a memory cell includes an N type substrate (or N type well), a gate, a gate dielectric layer, a P type source region and a P type drain region, a capacitor dielectric layer and a conductive plug.

When the memory cell is programmed, a voltage V9 is applied on the conductive plug, a voltage V10 is applied on the N type substrate (or N type well) and a voltage V11 is applied on the P type drain region, a voltage V12 is applied on the gate. The voltages V9, V10 and V11 are set to make the capacitor dielectric layer breakdown. The voltage V12 is set to open a channel under the gate. For example, the voltage V9 is about −3.3 Volts, the voltage V10 is about 3.3 Volts, the voltage V11 is about 3.3 Volts, the voltage V12 is about 0 Volt.

Please refer to FIG. 5B, a memory cell includes an N type substrate (or N type well), a gate, a gate dielectric layer, a P type source region and P type drain region, a capacitor dielectric layer and a conductive plug.

When the memory cell is programmed, a voltage V13 is applied on the conductive plug, a voltage V14 is applied on the N type substrate (or N type well) and a voltage V15 is applied on the gate, a voltage V16 is applied on the P type drain region. The voltages V13, V14 and V16 are such set to make the capacitor dielectric layer breakdown. For example, the voltage V13 is about 0 Volt, the voltage V14 is about 4 to 6 Volts, the voltage V15 is about 3.3 Volts, and the voltage V16 is about 4 to 6 Volts.

In the operating method of one time programmable memory cells of the present invention, a dielectric layer of the capacitor is damaged by controlling voltages applied on a gate, a drain, a source and a substrate of the transistor, to program the one time programmable e memory cell of the present invention. Moreover, digital information "0" or "1" is recorded by detecting whether the dielectric layer of the capacitor is damaged or not. The contact area of conductive plug with the capacitor dielectric layer is relatively small, which can result in increased current destiny where the conductive plug contacts with the capacitor dielectric layer when the one time programmable memory cell of the present invention is programmed. This can readily make the capacitor dielectric layer breakdown and the operating voltages are reduced.

Next, a fabricating method of a one time programmable memory cells according to the present invention will be described.

FIGS. 6A to 6E are cross-sectional views illustrating a manufacturing process of a one programmable memory cell according to one preferred embodiment of the present invention.

Figure 6A:
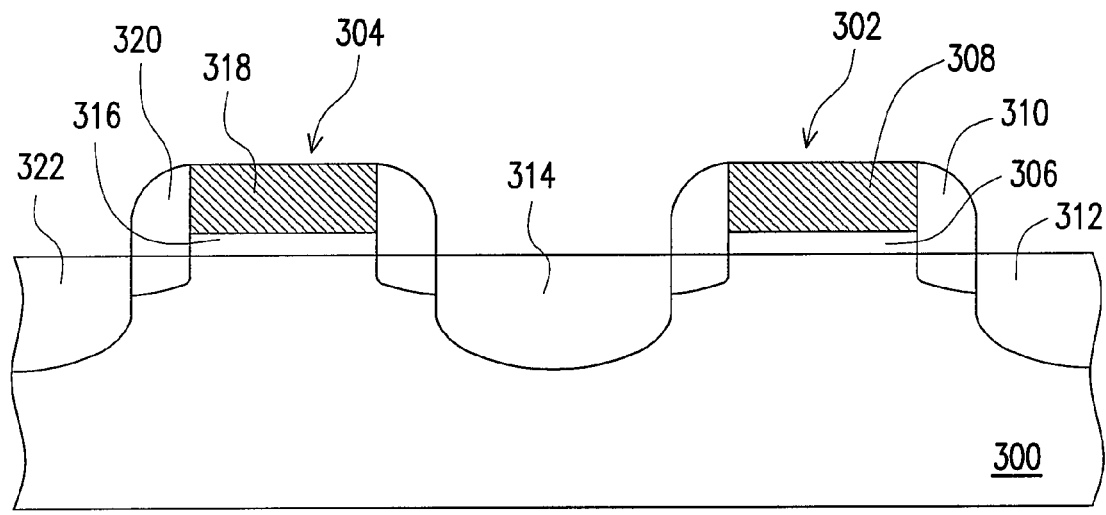
FIGS. 6A to 6E are cross-sectional views illustrating a manufacturing process of a one programmable memory cell according to one preferred embodiment of the present invention.

Please refer to FIG. 6A, at first, a substrate 300 is provided. The substrate 300 includes a silicon substrate, such as an N type silicon substrate or a P type silicon substrate. Of course, the substrate 300 can also be silicon on insulator substrate.

The substrate 300 is provided with, for example, transistors 302 and 304. The transistors 302 and 304 are connected in series, for example.

The transistor 302 is formed with a capacitor dielectric layer 306, a gate 308, spacers 310 and source/drain regions 312, 314.

A capacitor dielectric layer 306 is positioned between the gate 308 and the substrate 300. The material of the capacitor dielectric layer includes a silicon oxide or high-k material having dielectric constant higher than 4. The capacitor dielectric layer 306 is formed from one or more dielectric material layers. The spacers 310 are, for example, disposed on sidewalls of the gate 308. The material of the spacers 310 is, for example, silicon oxide or silicon nitride. For example, the source/drain regions 312, 314 are disposed in the substrate on the sides of the gate 308. The material of the gate 308 is, for example, doped polysilicon.

For example, the transistor 304 is formed from the gate dielectric layer 316, the gate 318, the spacers 320 and the source/drain regions 314, 322.

A gate dielectric layer 316 is disposed between the gate 318 and the substrate 300. The material of the gate dielectric layer 316 includes silicon oxide or high-k material having dielectric constant higher than 4. The gate dielectric layer 316 is formed from one or more dielectric material layers. The spacers 320 are, for example, disposed on sidewalls of the gate 318. The material of the spacers 320 is, for example, silicon, oxide or silicon nitride. For example, the source/drain regions 314, 322 are disposed in the substrate 300 on the sidewalls of the gate 318. The material of the gate 120 is, for example, doped polysilicon. The transistor 302 and the transistor 304 share the source/drain region 314.

Forming the transistor 302 and the transistor 304 on the substrate 300 is achieved by using common complementary metal oxide-semiconductor manufacturing process. Thus it will not be described in detail.

Figure 6B:
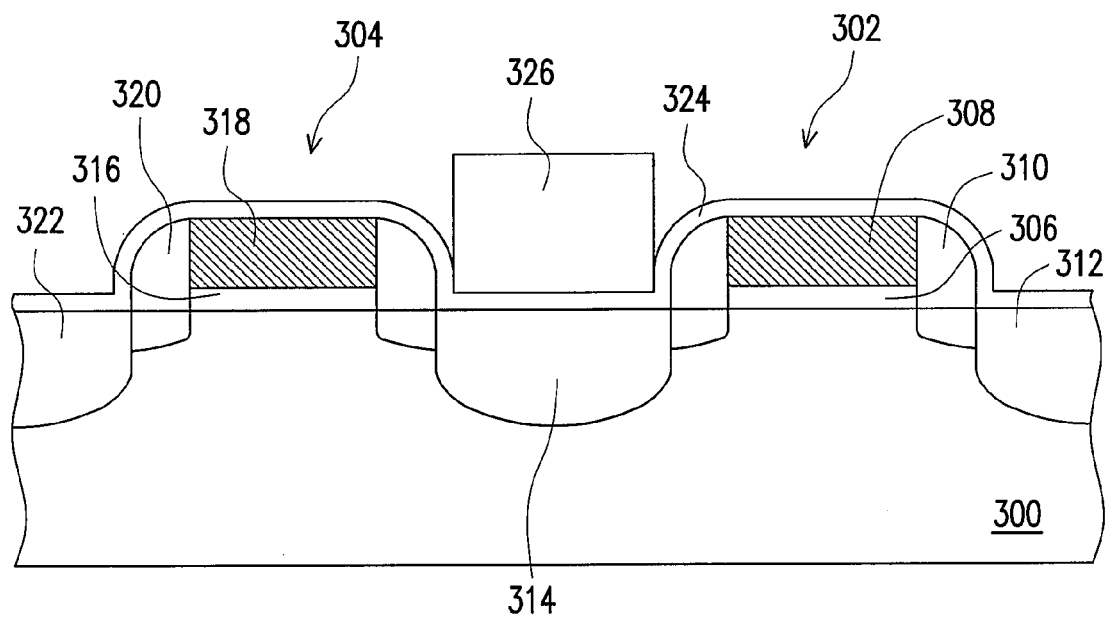

Please refer to FIG. 6B, a dielectric layer 324 is formed on the substrate 300. The dielectric layer 324 is served as a resistive protection oxide layer or a self-aligned silicide block layer. The material of the dielectric layer 324 is, for example, silicon oxide or silicon nitride. Then, a mask layer 326 is formed on the substrate 300. The mask layer 326 covers the dielectric layer 324 of the source/drain region 314. The material of the mask layer 326 is, for example, photoresist material. For example, the mask layer 326 is formed by following steps. At first, a layer of photoresist material is applied on the substrate by spinning process. The photolithography process is performed and the mask layer 326 is formed. Of course, the material of the mask layer 326 can also be other materials.

Figure 6C:
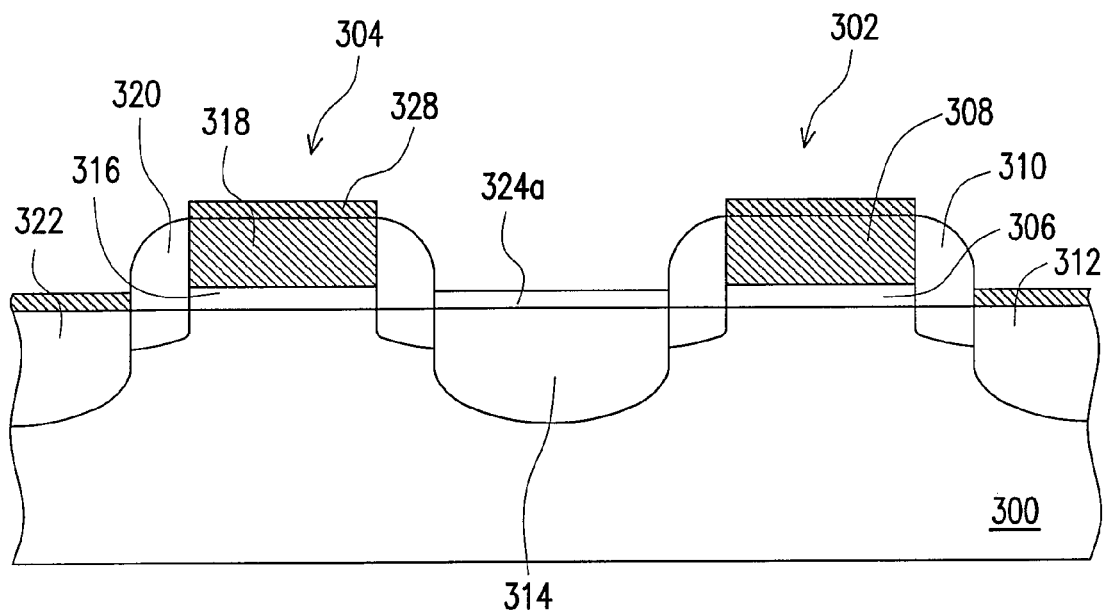

Please refer to FIG. 6C, the mask layer 326 is served as a mask, and a portion of the dielectric layer 324 are removed, only leaving the dielectric layer 324a on the source/drain region 314. The process of removing the dielectric layer 324 includes wet-etching or dry-etching. The wet-etching can use hydrofluoric acid as etchant. Then, the mask layer 326 is removed.

Subsequently, a metal silicide layer 328 is formed on the gate 308, the gate 318, the source/drain region 312 and the source/drain region 322. The material of the metal silicide layer 328 includes metal silicide of refractory metal, for example one silicide of nickel, cobalt, titanium, copper, molybdenum, tantalum, tungsten, erbium, zirconium, platinum and alloys thereof. The fabricating method of the metal silicide layer 328 is, for example self-aligning metal silicide process. The process includes following steps: at first a metal layer (not shown) is formed on the substrate 300. The material of the metal layer includes refractory metal, such as one of nickel, cobalt, titanium, copper, molybdenum, tantalum, tungsten, erbium, zirconium, platinum and alloys thereof. The metal layer is formed by evaporation, sputtering, electric plating, chemical vapor deposition (CVD) or physical vapor deposition. Then, an annealing process is performed, so that silicon of the gates 308 and 318, the source/drain regions 312 and 322 reacts with the metal layer, to form a metal silicide layer 328. Then, unreacted metal layer is removed. Removing process of the unreacted metal layer is, for example, performing a selective wet etch process. The unreacted metal layer is removed by utilizing mixed solution of hydrochloric acid/hydrogen peroxide or mixed solution of sulfuric acid/hydrogen peroxide as etchant, only leaving the metal silicide layer 328 on surfaces of the gates 308 and 318, the source/drain regions 312 and 322.

Figure 6D:
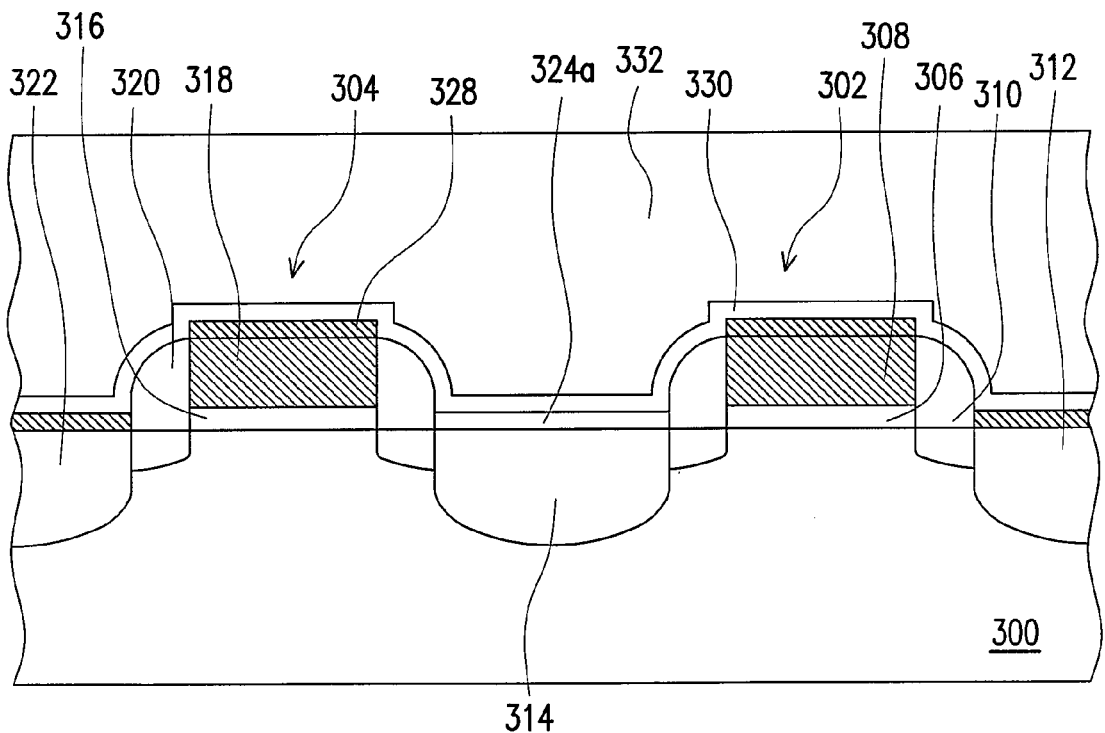

Please refer to FIG. 6D, an etch stop layer 330 is formed on the substrate 300. The etch stop layer 330 is disposed on and entirely covers the transistors 302 and 304. The material of the etch stop layer 330 is, for example, silicon nitride, which is formed by chemical vapor disposition process. Then, an interlayer insulating layer 332 is formed on the etch stop layer 330. The material of the interlayer insulating layer 332 is, for example, phosphorosilicate glass or borophosphorosilicate glass.

Figure 6E:
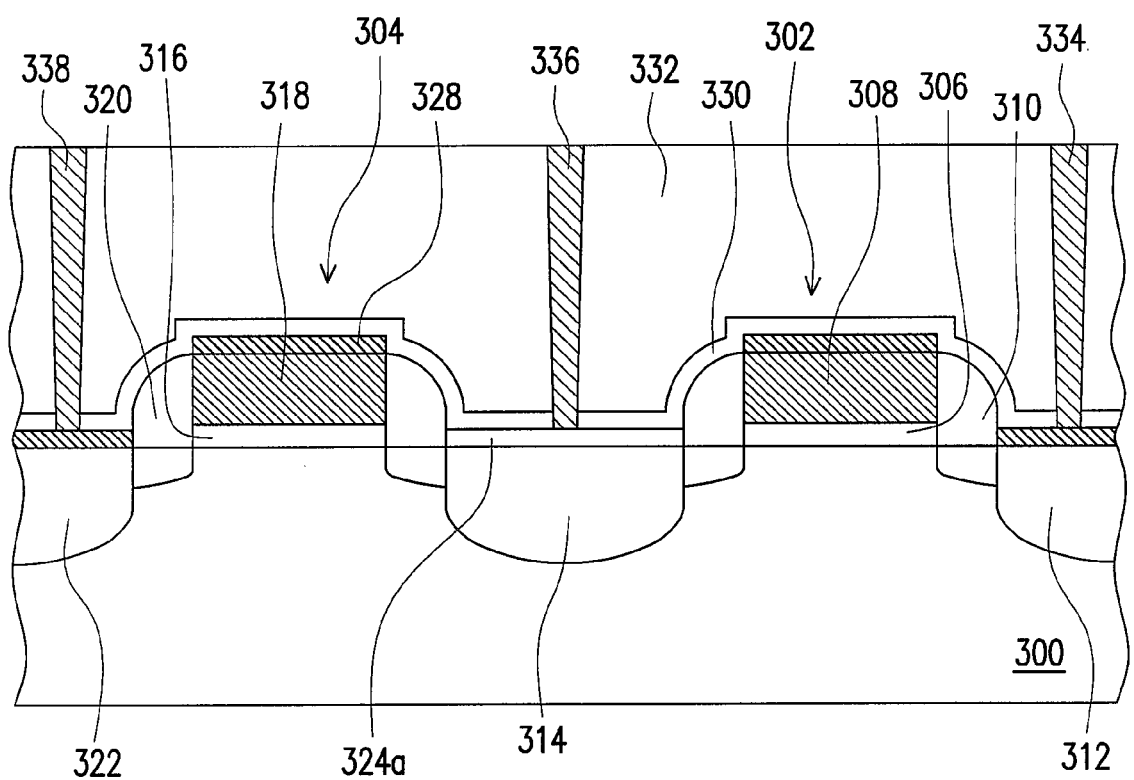

Please refer to FIG. 6E, conductive plugs 334, 336 and 338 are formed in the insulating layers 332. The conductive plug 334 and the conductive plug 338 are electrically connected to the source/drain region 312 and the source/drain region 322. The conductive plug 336 extends through the etch stop layer 330 and is connected with a dielectric layer 324a. The conductive plug 336, the dielectric layer 324a and the source/drain region 314 form a capacitor. The conductive plugs 334, 336, 338 are formed by the steps as following: at first, the insulating layer 332 is patterned to form plug openings. When a portion of the insulating layer 332 is removed to form the plug openings, etching will stop at the etch stop layer 330. Then, the etch stop layer 330 exposed by the plug openings is removed to expose the metal silicide layer 328 on the source/drain regions 312 and 322, and the dielectric layer 324a on the source/drain region 314. Conductive material is filled in the plug openings to form the conductive plugs.

In the fabricating method of a one time programmable memory cell according to the present invention, a capacitor is directly formed from the conductive plug 336, the dielectric layer 324a and the source/drain region 314, so the capacitor is fabricated without varying common general complementary metal oxide-semiconductor manufacturing process. The capacitor is directly disposed on the source/drain region 314. No additional space is required, and the integration of semiconductor devices is elevated.

As mentioned above, in the semiconductor capacitor, one time programmable memory cell and fabricating method and operating method thereof according to the present invention, a resistive protection oxide layer or a self-aligned silicide block layer is served as a capacitor dielectric layer, and a conductive plug and a doped region are served as electrodes of the capacitor. Wherein the doped region is a source/drain region of a transistor or is fabricated together with a source/drain region of a transistor in a same manufacturing process. The conductive plug is fabricated together with plugs connected to a gate, a source/drain region of a transistor in a same manufacturing process. Therefore, the capacitor is directly disposed on the source/drain region 314. No additional space is required, and the integration of semiconductor devices is elevated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor capacitor, comprising:
   a capacitor dielectric layer which is a resistive protection oxide layer or a self-aligned silicide block layer; and
   a first electrode and a second electrode disposed at opposing sides of the capacitor dielectric layer,
   wherein the semiconductor capacitor is disposed on a substrate;
   the second electrode is a doped region disposed in the substrate;
   the capacitor dielectric layer is disposed on the doped region, and exposes a portion of the doped region; and
   the first electrode is disposed on the capacitor dielectric layer.

2. The semiconductor capacitor according to claim 1, further comprising a metal silicide layer disposed on the doped region which is exposed on the capacitor dielectric layer; and
   a second conductive plug electrically connected to the metal silicide layer.

3. The semiconductor capacitor according to claim 1, wherein the first electrode is formed from one or more first conductive plugs and the shape of the first conductive plug comprises square, rectangle, round or other shapes.

4. The semiconductor capacitor according to claim 1, wherein the substrate comprises a silicon substrate or a silicon on insulator substrate; and
   the doped region is disposed in a silicon layer of the silicon on insulator substrate.

5. The semiconductor capacitor according to claim 1, wherein the first electrode is a conductive plug.

6. The semiconductor capacitor according to claim 1, further comprising an etch stop layer disposed on the capacitor dielectric layer, wherein the first electrode extends through the etch stop layer and contacts with the capacitor dielectric layer.

7. A semiconductor capacitor, comprising:
   a capacitor dielectric layer which is a resistive protection oxide layer or a self-aligned silicide block layer; and
   a first electrode and a second electrode disposed at opposing sides of the capacitor dielectric layer,
   wherein the semiconductor capacitor is disposed on an isolation structure of a substrate;
   the second electrode is a doped polysilicon layer disposed on the substrate;
   the capacitor dielectric layer is disposed on the doped polysilicon layer and exposes a portion of the doped polysilicon layer; and
   the first electrode is disposed on the capacitor dielectric layer.

8. The semiconductor capacitor according to the claim 7, further comprising a metal silicide layer disposed on the doped polysilicon layer which is exposed on the capacitor dielectric layer; and
   a second conductive plug electrically connected to the metal silicide layer.

9. The semiconductor capacitor according to claim 7, wherein the first electrode is a conductive plug.

10. The semiconductor capacitor according to claim 7, further comprising an etch stop layer disposed on the capacitor dielectric layer, wherein the first electrode extends through the etch stop layer and contacts with the capacitor dielectric layer.

11. A semiconductor capacitor, comprising:

a capacitor dielectric layer which is a resistive protection oxide layer or a self-aligned silicide block layer; and a first electrode and a second electrode disposed at opposing sides of the capacitor dielectric layer, wherein the semiconductor capacitor is disposed on an insulating substrate;

the second electrode is a doped semiconductor layer disposed on the insulating substrate;

the capacitor dielectric layer is disposed on the doped semiconductor layer, and exposes a portion of the doped semiconductor layer; and the first electrode is disposed on the capacitor dielectric layer.

12. The semiconductor capacitor according to the claim 11, wherein the insulating substrate is a glass substrate.

13. The semiconductor capacitor according to claim 11, wherein the first electrode is a conductive plug.

14. The semiconductor capacitor according to claim 11, further comprising an etch stop layer disposed on the capacitor dielectric layer, wherein the first electrode extends through the etch stop layer and contacts with the capacitor dielectric layer.

* * * * *